United States Patent [19]

Hatakeyama et al.

[11] Patent Number: 5,216,241
[45] Date of Patent: Jun. 1, 1993

[54] FAST ATOM BEAM SOURCE

[75] Inventors: Masahiro Hatakeyama, Kanagawa; Kazutoshi Nagai, Tokyo, both of Japan

[73] Assignee: Ebara Corporation, Tokyo, Japan

[21] Appl. No.: 845,202

[22] Filed: Mar. 3, 1992

[30] Foreign Application Priority Data

Mar. 5, 1991 [JP] Japan .................... 3-8607

[51] Int. Cl.⁵ .............................. H05H 3/02
[52] U.S. Cl. ................................. 250/251
[58] Field of Search .......... 250/251, 423 R; 315/111.21, 111.81

[56] References Cited

U.S. PATENT DOCUMENTS 4,140,943  2/1979  Ehlers ................. 315/111.4
4,447,732  5/1984  Leung et al. ........ 315/111.81
4,481,062  11/1984 Kaufman et al. ..... 250/423 R
5,055,672  10/1991 Nagai ................. 250/251
5,075,594  12/1991 Schumacher et al. .... 315/111.81

FOREIGN PATENT DOCUMENTS 0093831 11/1983 European Pat. Off. .

OTHER PUBLICATIONS

Gohda, H. et al., "SIMS Analysis of Insulating Materials Using a New Type Electron Neutralizing Gun", *Materials for the 54th Study Meeting of the Japan Society for the Promotion of Sciences*, No. 604, pp. 46–51 (Dec. 1987).

Shimokawa, F. and Nagai, K. "A Low Energy Fast-Atom Source", *Nuclear Instruments and Methods in Physics Research B33*, (198) pp. 867–870, as reprinted from Nuclear Instruments and Methods in Physics Research B.

Fusao Shimokawa and Kazutoshi Nagai, "A Low-Energy Fast-Atom Source", *Nuclear Instruments & Methods in Physics Research, Section*-B, vol. B33, No. 1–4, Jun. 1988, pp. 867–870.

Primary Examiner—Paul M. Dzierzynski
Assistant Examiner—Kiet T. Nguyen
Attorney, Agent, or Firm—Wenderoth, Lind & Ponack

[57] ABSTRACT

A fast atom beam source is capable of emitting a fast atom beam with low energy efficiently and is compact. A reaction gas mixed with a halogen or a halide is introduced into a fast atom beam source casing through a plate-shaped anode, and gas ions that are produced by a plasma discharge induced at a relatively low discharge voltage are converted into a fast atom beam, which is emitted from fast atom beam emitting holes provided in a plate-shaped cathode that is disposed opposite the anode.

3 Claims, 2 Drawing Sheets

FAST ATOM BEAM SOURCE

BACKGROUND OF THE INVENTION

The present invention relates to a fast atom beam source and, more particularly, to fast atom beam source structure that is capable of emitting a fast atom beam efficiently at a relatively low discharge voltage.

As is well known, atoms and molecules undergo a thermal motion in the atmosphere at room temperature when possessing a kinetic energy of about 0.05 eV. "Fast atoms" are atoms and molecules that have a kinetic energy over about 0.05 eV, and when such particles are emitted in one direction, they are called "fast atom beam".

FIG. 2 shows exemplarily a fast atom beam source that emits argon atoms with a kinetic energy of 0.5 to 10 keV, among conventional fast atom beam sources designed to generate fast beams of gas atoms. In the figure, reference numeral 1 denotes a cylindrical cathode that also serves as a casing, 2 a doughnut-shaped anode, 3 a DC high-voltage power supply, 4 a gas nozzle, 5 argon gas, 6 plasma, 7 fast atom beam emitting-holes, and 8 a fast atom beam.

The constituent elements, exclusive of the high-voltage power supply 3, are incorporated in a vacuum container (not shown).

The conventional fast atom beam source comprising the above-described constituent elements operates as follows.

After the vacuum container has been sufficiently evacuated, argon gas 5 is injected into cylindrical cathode 1 from the gas nozzle 4. Meanwhile, a high DC voltage is impressed between the anode 2 and the cathode 1 by the DC high-voltage power supply 3 in such a manner that the anode 2 has a positive potential, and the cathode 1 a negative potential.

As a result of the above-described process, electric discharge occurs between the cathode 1 and the anode 2 to generate plasma 6, thus producing argon ions and electrons. During this process, electrons that are emitted from the inner wall surface at one end of the cylindrical cathode 1 are accelerated toward the anode 2 and pass through the central hole in the anode 2 to reach the inner wall surface at the other end of the cathode 1. The electrons reaching the inner wall surface at the second end lose their speed. Then, the electrons are turned around and are accelerated toward the anode 2 to pass again through the hole of the anode 2 before reaching the inner wall surface at the first end of the cathode 1. Such repeated motion of electrons forms a high-frequency vibration between the two end faces of the cylindrical cathode 1 across the anode 2, and while making the repeated motion, the electrons collide with the argon gas to produce a large number of argon ions. The argon ions produced in this way are accelerated toward each end face of the cylindrical cathode 1 to obtain a sufficiently large kinetic energy. The kinetic energy obtained at this time is, for example, about 1 keV when the discharge sustaining voltage impressed by the DC high-voltage power supply 3 is 1 kV. In other words, there is a turning point of electrons vibrating at high frequency in the vicinity of each end face of the cylindrical cathode 1. This point is a region where a large number of electrons with low energy are present. Argon ions change to argon atoms in this region by collision and recombination with the electrons. In the collision between the ions and the electrons, since the electrons are so much smaller than that of the argon ions that their mass can be considered negligible, the argon ions deliver the kinetic energy to the atoms whose charge changes without substantial loss, thus forming fast atoms. Accordingly, the kinetic energy of the fast atoms is about 1 keV. The fast atoms accelerated are emitted in the form of a fast atom beam 8 to the outside through the emitting holes 7 provided in the second end face of the cylindrical cathode 1.

The above-described conventional fast atom beam source suffers, however, from some problems described below. To increase the rate of emission of the fast atom beam, the prior art needs to raise the discharge voltage, use a magnet jointly with the described arrangement, or increase the pressure of the argon gas introduced and cannot adopt any other method, as can be understood from the above-described matters, that does not result in an increase in the energy of the fast atom beam, or an increase in the overall size of the apparatus, or an extension in the energy band of the fast atom beam, etc. Thus, the prior art presents many problems and difficulties in use.

SUMMARY OF THE INVENTION

In view of the above-described circumstances, it is an object of the present invention to provide a compact fast atom beam source which is capable of emitting a fast atom beam efficiently at a relatively low discharge voltage.

To attain the above-described object, the present invention provides a fast atom beam source which comprises a plate-shaped cathode having a multiplicity of fast atom beam emitting-holes, a plate-shaped anode disposed opposite the plate-shaped cathode at a predetermined distance therefrom, a filament disposed inbetween the plate-shaped anode and cathode, a fast atom beam source casing incorporating the two electrodes and the filament, a gas nozzle communicating with the plate-shaped anode to introduce a reaction gas, which is readily ionized on heating, into the fast atom beam source casing, the reaction gas containing either a halogen or a halide, a DC high-voltage power supply connected between the plate-shaped cathode and anode to induce an electric discharge between the two electrodes, and a power supply for heating the filament.

These constituent elements, exclusive of the high voltage power supply, are incorporated in a vacuum container (not shown).

The reaction gas that is introduced into the fast atom beam source casing is readily ionized when heated because it is a mixture containing, for example, a halogen or a halide, thereby improving the discharge efficiency. In addition, the reaction gas is introduced into the source casing through the plate-shaped anode, and gas ions generated in the space between the two electrodes are emitted from the fast atom beam emitting-holes of the plate-shaped cathode after being accelerated by the cathode. The structure of the apparatus is thus simple and compact.

BRIEF DESCRIPTION OF THE DRAWING

The above and other objects, features and advantages of the present invention will become more apparent from the following description of the preferred embodiment thereof, taken in conjunction with the accompanying drawings, in which like reference numerals denote like elements, and of which.

DETAILED DESCRIPTION OF THE PREFERRED EMBODIMENT

Figure 1:
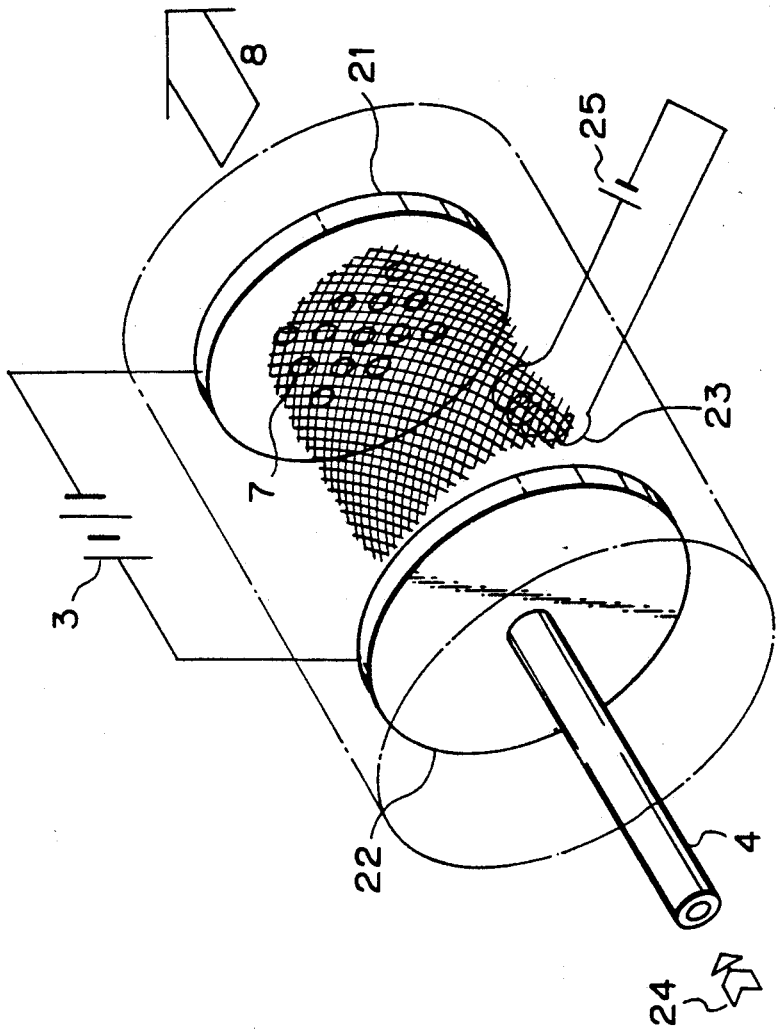
FIG. 1 is a schematic view of one embodiment of a fast atom beam source according to the present invention.

One embodiment of the present invention will be described below in detail with reference to FIG. 1. In this embodiment, constituent elements having the same functions as those of the prior art described above in connection with FIG. 2 are denoted by the same reference numerals.

Figure 2:
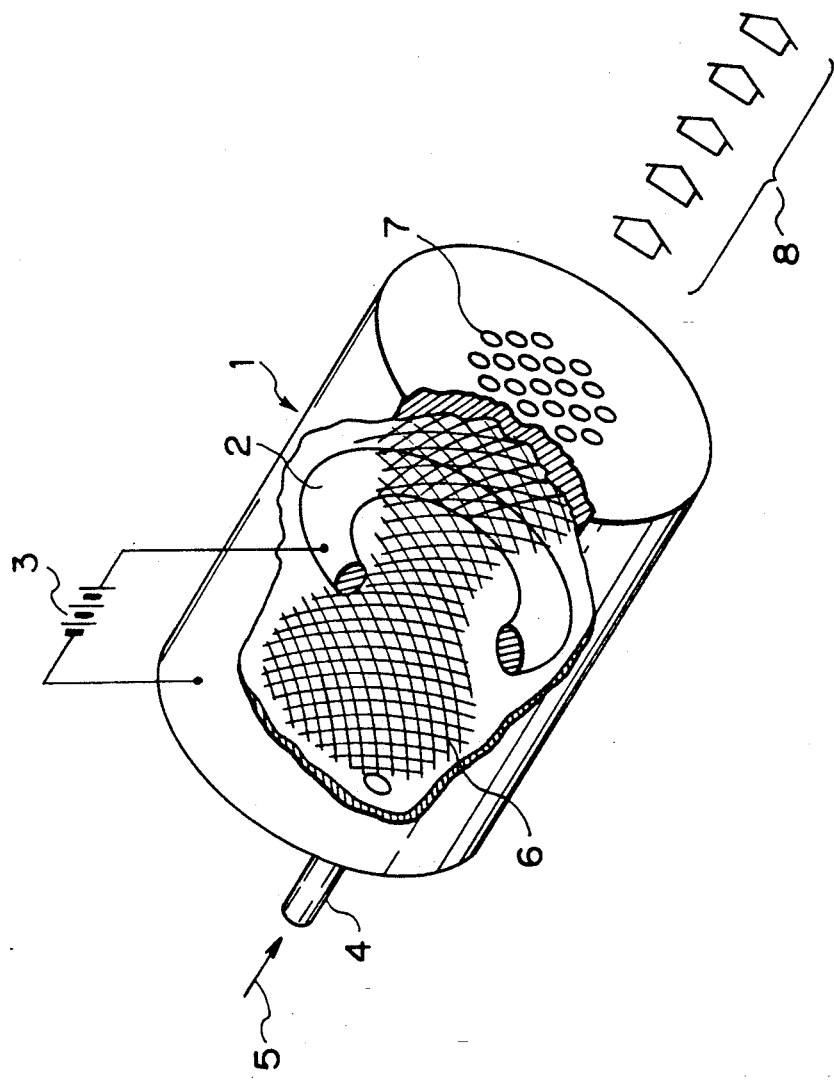
FIG. 2 is a schematic view of a fast atom beam source according to a prior art.

Referring to FIG. 1, a plate-shaped cathode 21 and a plate-shaped anode 22, which are disposed at a predetermined distance from each other, are placed in a fast atom beam source casing shown by the one-dot chain line and are connected to a DC high-voltage power supply 3 that is disposed outside the fast atom beam source casing. A hot filament 23 made of platinum is disposed inbetween the plate-shaped cathode 21 and the plate-shaped anode 22. The hot filament 23 is connected to a heating power supply 25 that is disposed outside the vacuum container in the same way as the case of the DC high-voltage power supply 3.

A gas nozzle 4 is secured to the plate-shaped anode 22 and communicates therewith in order to introduce a reaction gas 24 into the fast atom beam source casing from the outside thereof. The plate-shaped cathode 21 has a plurality of fast atom beam emitting-holes 7 provided in the surface thereof to enable a fast atom beam 8 to be emitted therefrom.

One of the advantageous features of the present invention resides in that the reaction gas 24 contains either a halogen or a halide, which is readily ionized when heated.

The operation of the fast atom beam source arranged as described above will be explained next.

After a vacuum container (not shown) has been sufficiently evacuated, the reaction gas 24 is introduced into the space between the plate-shaped anode 22 and the plate-shaped cathode 21 through the gas nozzle 4. At the same time that the reaction gas 24 is introduced, the filament 23 is heated to emit thermal electrons. Further, a high DC voltage is applied between the anode 22 and the cathode 21 to induce an electric discharge between the two electrodes.

As a result of the above-described process, plasma is generated, and gas ions of the reaction gas 24 and electrons are produced. The gas ions thus produced are accelerated toward the cathode 21 to give them a large energy. Furthermore, the gas ions lose their electric charges through collision with gas particles remaining in the region in the vicinity of the cathode 21 or through recombination with electrons, thereby being converted into fast atoms. The fast atoms are emitted in the form of a fast atom beam 8 traveling to the outside from the fast atom beam emitting holes 7.

In the fast atom beam source arranged and operated as described above, the reaction gas 24 is mixed with either a halogen or a halide, either of which is readily ionized when heated as has already been stated. Therefore, the reaction gas 24 is ionized immediately by contact with the hot filament 23 to generate a large number of ions and electrons. Accordingly, the reaction gas 24 enables the electric discharge to be readily sustained to emit the fast atom beam 8 even if the supply voltage is relatively low. In other words, it is possible to obtain a fast atom beam with a relatively low energy. On the other hand, since the hot filament 23 is heated to a high temperature, it reacts readily with the gas 24 introduced when the latter is highly reactive, so that the hot filament 23 could deteriorate or become disconnected. To avoid such a problem, in this embodiment the hot filament 23 is made of platinum, which is an inert metal.

Thus, according to the fast atom beam source of the present invention, a gas which is readily ionized when heated is employed as a reaction gas, so that the electric discharge can be sustained at a relatively low discharge voltage and hence a fast atom beam with a relatively low energy can be obtained. In addition, since the reaction gas is introduced into the fast atom beam source casing through the anode and the resulting fast atom beam is emitted from the emitting holes provided in the cathode, the apparatus has a simple, compact structure.

In addition, the fast atom beam with low energy that is obtained by the present invention can fabricate the surface of a solid or modify it without causing serious damage to the solid material when collided therewith. Thus, the fast atom beam produced by the fast atom beam source of the present invention can be advantageously utilized for the fine pattern processing of semiconductors, analytical purposes, etc. In particular, since the fast atom beam is electrically neutral, it can be supplied not only to metals and semiconductors but also to insulators such as plastics, ceramics, etc., to which the ion beam technique had not been effectively applied, in general, in the past.

Although the present invention has been described through specific terms, it should be noted here that the described embodiment is not necessarily exclusive and that various changes and modifications may be imparted thereto without departing from the scope of the invention which is limited solely by the appended claims.

What is claimed is:

1. A fast atom beam source comprising:
   a plate-like cathode having a plurality of fast atom beam-emitting holes extending therethrough;
   a plate-like anode spaced a predetermined distance from and facing said cathode;
   a fast atom beam source casing surrounding said cathode and said anode;
   a DC high voltage power supply operatively electrically connected to said cathode and said anode so as to induce an electric discharge between said cathode and said anode;
   a gas nozzle open to the interior of said fast atom beam source casing;
   a gaseous mixture including a reaction gas and either a halogen or a halide introduced within said casing via said gas nozzle;
   a platinum filament disposed within the space between said cathode and said anode; and
   a power supply connected to said platinum filament, whereby the reaction gas containing said halogen or halide is readily ionized by the heating thereof with the platinum filament.

2. A fast atom beam source as claimed in claim 1, wherein said gas nozzle extends into said casing and is secured to said anode.

3. A method of generating a fast atom beam, said method comprising:

introducing a gaseous mixture of a reaction gas and either a halogen or halide into a space between a plate-like cathode having a plurality of fast atom beam-emitting holes extending therethrough and a plate-like anode;

inducing an electric discharge between said cathode and said anode by impressing a high DC voltage therebetween; and heating the gaseous mixture in said space with a platinum filament to a temperature at which ionization of said halide or halogen occurs.

* * * * *

UNITED STATES PATENT AND TRADEMARK OFFICE
CERTIFICATE OF CORRECTION

PATENT NO. : 5,216,241

DATED : June 1, 1993

INVENTOR(S) : Masahiro HATAKEYAMA et al.

It is certified that error appears in the above-identified patent and that said Letters Patent is hereby corrected as shown below:

On the title page: under the Priority Date of item [30], the number of the priority document has been changed from "3-8607" to --3-38607--.

Signed and Sealed this

Eighth Day of March, 1994

*Attest:*

BRUCE LEHMAN

*Attesting Officer*   *Commissioner of Patents and Trademarks*